United States Patent
Kuo et al.

(10) Patent No.: US 10,249,790 B2
(45) Date of Patent: Apr. 2, 2019

(54) LIGHT EMITTING DIODE AND FABRICATION METHOD THEROF

(71) Applicant: XIAMEN SANAN OPTOELECTRONICS TECHNOLOGY CO., LTD., Xiamen (CN)

(72) Inventors: Huan-shao Kuo, Xiamen (CN); Chun-Yi Wu, Xiamen (CN); Chaoyu Wu, Xiamen (CN); Ching-Shan Tao, Xiamen (CN); Duxiang Wang, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

(21) Appl. No.: 15/871,043

(22) Filed: Jan. 14, 2018

(65) Prior Publication Data

US 2018/0151776 A1 May 31, 2018

Related U.S. Application Data

(63) Continuation of application No. PCT/CN2016/111664, filed on Dec. 23, 2016.

(30) Foreign Application Priority Data

Mar. 17, 2016 (CN) .......................... 2016 1 0151425

(51) Int. Cl.
| | | |
|---|---|---|
| *H01L 33/26* | (2010.01) | |
| *H01L 33/08* | (2010.01) | |
| *H05B 33/08* | (2006.01) | |
| *H01L 33/40* | (2010.01) | |
| *F21Y 115/10* | (2016.01) | |

(Continued)

(52) U.S. Cl.
CPC .............. *H01L 33/26* (2013.01); *H01L 33/08* (2013.01); *H01L 33/405* (2013.01); *H05B 33/0803* (2013.01); *F21Y 2115/10* (2016.08); *H01L 33/12* (2013.01); *H01L 33/32* (2013.01)

(58) Field of Classification Search
CPC ..... H01L 33/26; H01L 33/08; H05B 33/0803; F21Y 2115/10
See application file for complete search history.

(56) References Cited

U.S. PATENT DOCUMENTS 8,847,249 B2* 9/2014 Raring .................... H01L 33/08
257/89

FOREIGN PATENT DOCUMENTS

| CN | 101601140 A | 12/2009 |
|---|---|---|
| CN | 103190005 A | 7/2013 |

* cited by examiner

*Primary Examiner* — David Vu
(74) *Attorney, Agent, or Firm* — Syncoda LLC; Feng Ma

(57) ABSTRACT

A light emitting diode includes a segmented quantum well formed via selective growth method to avoid re-absorption effect of photons in the LED internal quantum well. This improves external extraction efficiency and increases luminance. The light emitting diode includes a first semiconductor layer, an active layer, and a second semiconductor layer, wherein, the upper surface of the first semiconductor layer has a first growth region and a second growth region; the active layer is formed only in the first growth region via selective epitaxial growth; and the second semiconductor layer covers the active layer and the second growth region of the first semiconductor layer via epitaxial growth.

17 Claims, 4 Drawing Sheets

(51) Int. Cl.
*H01L 33/12* (2010.01)
*H01L 33/32* (2010.01)

LIGHT EMITTING DIODE AND FABRICATION METHOD THEROF

CROSS-REFERENCE TO RELATED APPLICATIONS

The present application is a continuation of, and claims priority to, PCT/CN2016/111664 filed on Dec. 23, 2016, which claims priority to Chinese Patent Application No. 201610151425.1 filed on Mar. 17, 2016. The disclosures of these applications are hereby incorporated by reference in their entirety.

BACKGROUND

Light Emitting Diode (LED) is a semiconductor solid light-emitting device, using semiconductor PN junction as the light emitting material for direct photovoltaic conversion. As LED application extends widely, it is imperative to further improve light emitting efficiency.

SUMMARY

The inventors of the present disclosure have recognized that, LED lighting effect mainly depends on internal quantum efficiency and light extraction efficiency. The former one is based on the epitaxial transistor quality of the light emitting material, and the latter is determined by such factors as chip structure, light emitting interface shape and refractive index of the packaging material. The refractive index of the semiconductor material differs much from that of air or packaging material (such as epoxy resin), resulting in serious total reflection. The light is reflected back and moved back and forth inside the LED, and then absorbed by the light-absorbing substrate and the quantum well with approximate energy gap during photon oscillation, causing luminance loss.

To solve the above problems, various embodiments of the present disclosure provide a segmented quantum well formed via selective growth methods to avoid re-absorption effect of photons in the LED internal quantum well. This improves external extraction efficiency and increases luminance.

In some embodiments, a light emitting diode comprises a first semiconductor layer, an active layer and a second semiconductor layer, wherein, the upper surface of the first semiconductor layer is at least divided into a first growth region and a second growth region; the active layer is formed only in the first growth region via selective epitaxial growth; and the second semiconductor layer covers the active layer and the second growth region of the first semiconductor layer via epitaxial growth.

In some embodiments, the light emitting diode also comprises a first semiconductor buffer layer between the first semiconductor layer and the active layer, formed only in the first growth region of the first semiconductor layer via epitaxial growth.

In some embodiments, the light emitting diode also comprises a second semiconductor buffer layer between the second semiconductor layer and the active layer, which covers the active layer and the second growth region of the first semiconductor layer via epitaxial growth.

In some embodiments, the upper surface of the first semiconductor layer can be divided into a first growth region, a second growth region and a third growth region, wherein, the first and the third growth regions are separated by the second growth region; the active layer is formed only in the first growth region and the third growth region via epitaxial growth, so as to form an alternating active layer; the second semiconductor layer covers the active layer and the second growth region of the first semiconductor layer via epitaxial growth. Thus, second absorption during reflection can be avoided through alternating design while maintaining the light emitting area basically same as that of conventional active layers.

Further, the active layers in the first growth region and the third growth region can reflect lights with different wave bands respectively to mix into white light.

Further, the active layer can be quantum wells of different forms, such as the match of a double-hetero structure and a quantum well structure. In some embodiments, the active layer in the first growth region is a quantum well structure, and the active layer in the third growth region is a double-hetero structure. With wide well and barrier, the double-hetero structure sees less carrier overflow than that of the quantum well structure during high temperature. Thus, the combination of a double-hetero structure can improve defects of the quantum well structure during high temperature.

Further, areas of the first growth region and the third growth region are S1 and S3 respectively, where: S1>S3.

In another aspect, a fabrication method of the light emitting diode is provided, the method including: 1) providing a substrate, and forming a first semiconductor layer over the substrate; 2) dividing the upper surface of the first semiconductor layer into at least a first growth region and a second growth region; 3) forming an active layer in the first growth region of the first semiconductor layer via selective epitaxial growth; and 4) forming a second semiconductor layer in the active layer and the second growth region of the first semiconductor layer via epitaxial growth.

In some embodiments, in step 2), at first, grow a first semiconductor layer in the first growth region of the first semiconductor layer, and then grow an active layer.

In some embodiments, in step 2), at first, grow a first semiconductor layer in the first growth region of the first semiconductor layer, and then grow a first semiconductor buffer layer, and lastly grow an active layer.

In some embodiments, in step 4), at first, grow a second semiconductor buffer layer in the active layer and the second growth region of the first semiconductor layer via epitaxial growth, and then grow a second semiconductor layer.

In some embodiments, in step 2), divide the upper surface of the first semiconductor layer into at least a first growth region, a second growth region and a third growth region, wherein, the first and the third growth regions are separated by the second growth region; in step 3), form an active layer in the first growth region of the first semiconductor layer and the third growth region via epitaxial growth to form an alternating active layer.

In some embodiments, in step 3), form the active layer via twice epitaxial growth; at first, grow a first active layer in the first growth region, and then grow a second active layer in the third growth region.

In some embodiments, the first active layer and the second active layer reflect lights of different wave bands to mix into white light.

In some embodiments, the first active layer is a quantum well structure, and the second active layer is a double-hetero structure.

In another aspect, a light-emitting system is provided including a plurality of the LEDs described above. The light-emitting system can be used in the applications such as lighting, display, signage, etc.

Other features and advantages of various embodiments of the present disclosure will be described in detail in the following specification, and it is believed that such features and advantages will become more obvious in the specification or through implementations of the described embodiments. Objectives and other advantages of embodiments of the present disclosure can be realized and obtained in the structures specifically described in the specifications, claims and drawings.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

DETAILED DESCRIPTION

The embodiments of the present disclosure will be described in detail with reference to the accompanying figures and preferred embodiments.

Figure 1:
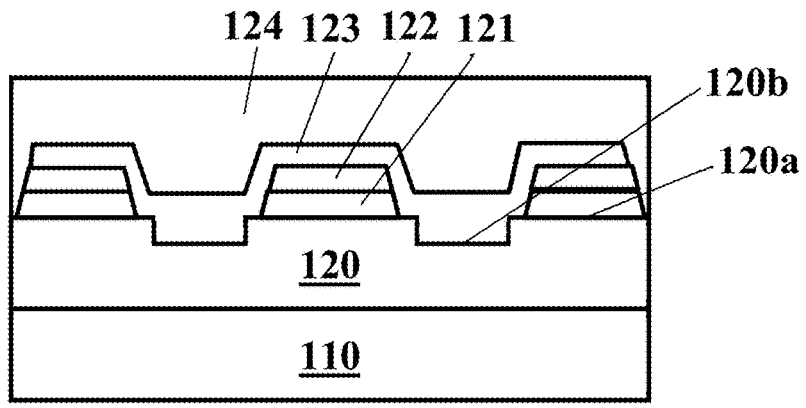
FIG. 1 is a sectional view of an LED epitaxial structure according to some embodiments.

Referring to FIG. 1, an epitaxial structure of a light emitting diode according to the present invention, comprises: a substrate 110, a first semiconductor layer 120, an active layer 122 and a second semiconductor layer 124, wherein, the upper surface of the first semiconductor layer 120 is divided into a first growth region 120a and a second growth region 120b, in which, the active layer 122 is a segmented structure formed over the surface of the first growth region 120a via selective growth.

The substrate 110 can be sapphire, AlN, GaN, Si, SiC and other materials, and the surface structure can be a plane structure or a patterned structure. When the first semiconductor layer 120 is a p-type semiconductor, the second semiconductor layer 124 can be an n-type semiconductor in different electrical property; and when the first semiconductor layer 120 is an n-type semiconductor, the second semiconductor layer 124 can be a p-type semiconductor in different electrical property. The active layer 122 can be a neutral, a p-type or an n-type semiconductor. When applied current passes through the semiconductor light-emitting laminated layer, it triggers the active layer 122 to emit light. When the active layer 122 is made of nitride-based material, blue or green light will be emitted; when made of AlInGaP-based material, red, orange or yellow light in amber color will be emitted. In this embodiment, the first semiconductor layer 120 is an n-type semiconductor; the second semiconductor layer 124 is a p-type semiconductor, and the active layer 122 is an AlGaInP multiple-quantum well structure.

Further, a first semiconductor buffer layer 121 is formed between the first semiconductor layer 120 and the active layer 122, and a second semiconductor buffer layer 123 is formed between the active layer 122 and the second semiconductor layer 124. Specifically, the first semiconductor layer 120 is a Si-doped AlGaInP material layer with Si concentration of $7\times10^{17}$-$1\times10^{18}$, and the second semiconductor layer 124 is a Mg-doped GaP material layer with doping concentration above $1.5\times10^{18}$; and both the first and the second semiconductor buffer layers are $(Al_{0.7}Ga_{0.3})$ InP material layers. In other embodiments, the active layer 122 is nitride material; a superlattice stress buffer layer 121 can be formed between the first semiconductor layer 120 and the active layer; and an electronic blocking layer is formed between the active layer 122 and the second semiconductor layer 124.

Figure 3:
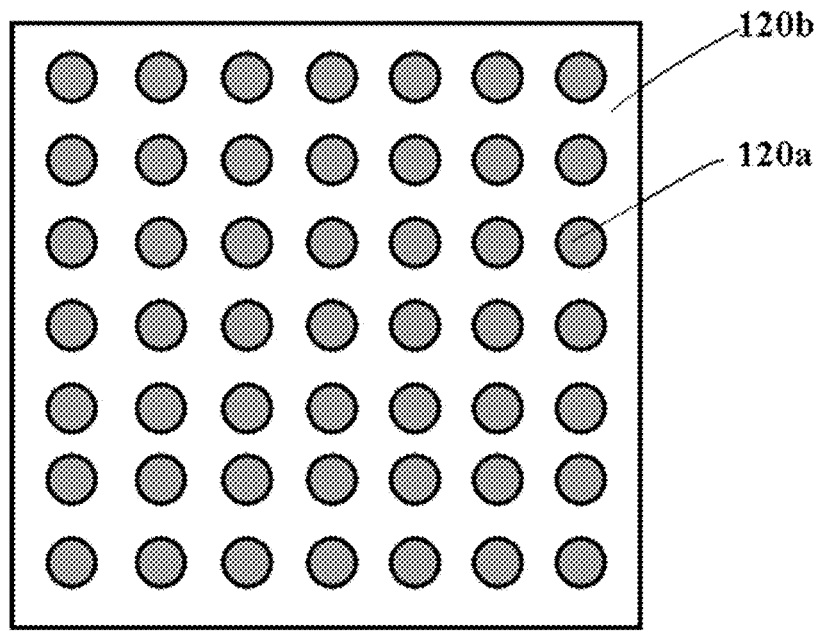
FIG. 3 shows the surface pattern of the first semiconductor layer in step 3 as shown in FIG. 2.

In this embodiment, the upper surface pattern of the first semiconductor layer 120 is designed mainly to improve luminance, which reduces light absorption of the quantum well of the active layer while guaranteeing effective light emitting area of the active layer. Referring to FIG. 3, a preferred pattern is shown, where, the first growth region 120a is a series of mutually-separated patterns, which can be round, square, hexagon, and the like. Therefore, when the second semiconductor buffer layer 121 and the active layer 122 are formed over the first growth region 120a of the first semiconductor layer via selective growth, a series of segmented quantum well structures can be formed, thereby avoiding re-absorption effect of photons of the internal quantum well of the LED.

Figure 2:
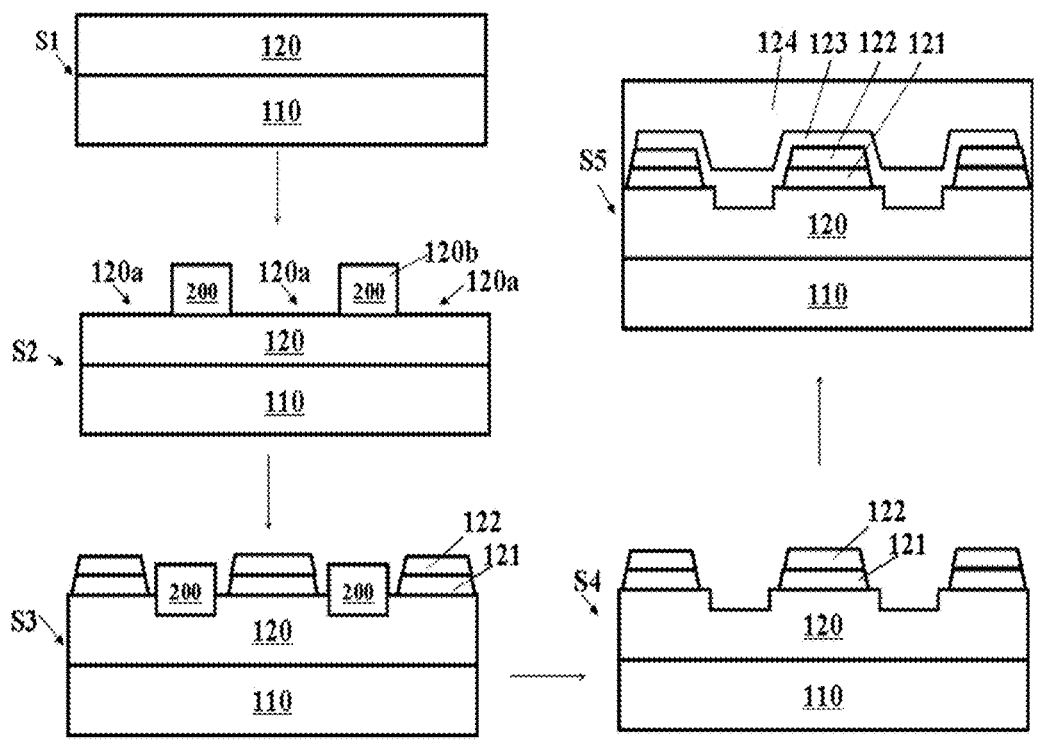
FIG. 2 is a schematic diagram for fabricating the LED epitaxial structure as shown in FIG. 1.

The aforesaid LED epitaxial structure will be described in combination with FIG. 2 and specific fabrication method. In this embodiment, an AlGaInP-based red-light LED is taken as an example.

Step 1 (S1): grow a first semiconductor layer 120 over the GaAs substrate via MOCVD;

Step 2 (S2): deposit a $SiO_x$ mask layer 200 of about 2 μm thick over the upper surface of the first semiconductor layer 120 via PECVD, and define a first growth region 120a and a second growth region 120b via yellow light process, wherein, the second growth region is BOE etched, and the photo-resistance is removed after etching;

Step 3 (S3): take second epitaxial growth for the pattern-defined epitaxial wafer via MOCVD; at first, grow a 50-100 nm first semiconductor layer 120, and then grow a 50-70 nm first semiconductor buffer layer 121, and stop growth after the active layer is finished;

Step 4 (S4): remove the $SiO_x$ mask layer 200 of the first growth region 120a of the first semiconductor layer;

Step 5 (S5): further finish the growth of the second semiconductor buffer layer 123 and the second semiconductor layer 124 via MOCVD, wherein, the second semiconductor buffer layer 123 and the second semiconductor layer 124 cover the first growth region 120a of the first semiconductor layer and the upper surface of the active layer 122.

In the aforesaid method, at first, define a growth region of the active layer over the upper surface of the first semiconductor layer 120, and form a segmented quantum well structure via selective epitaxial growth to effectively guarantee epitaxial quality of the quantum well of the active layer and the completeness of the structure.

Figure 4:
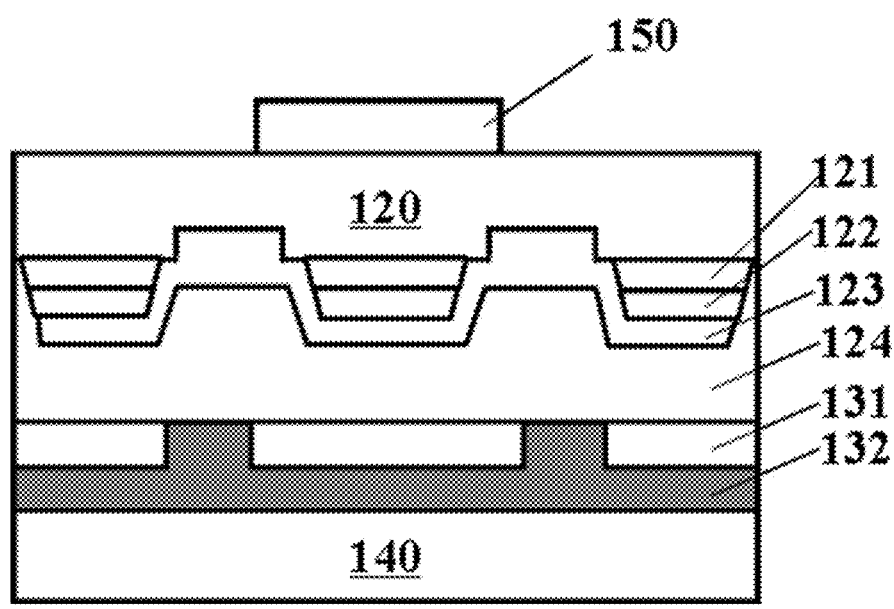
FIG. 4 is a sectional view of a LED chip structure according to some embodiments.

FIG. 4 shows a sectional view of a LED chip structure fabricated by the epitaxial structure as shown in FIG. 1. The LED chip comprises from bottom to up: a conductive substrate 140, a high-reflectivity mirror system composed of a high-reflectivity metal layer 132 and a low-reflectivity dielectric layer 131, a second semiconductor layer 124, a second semiconductor buffer layer 123, an active layer 122, a first semiconductor buffer layer 121, a first semiconductor layer 120 and a top electrode 150. In this LED chip structure, remove the substrate 110, and replace the substrate with a conductive substrate 140 made of material which reduces light absorption; and a high-reflectivity mirror system is set between the conductive substrate 140 and the second semiconductor layer 124 to further improve light absorption efficiency of the device.

Figure 5:
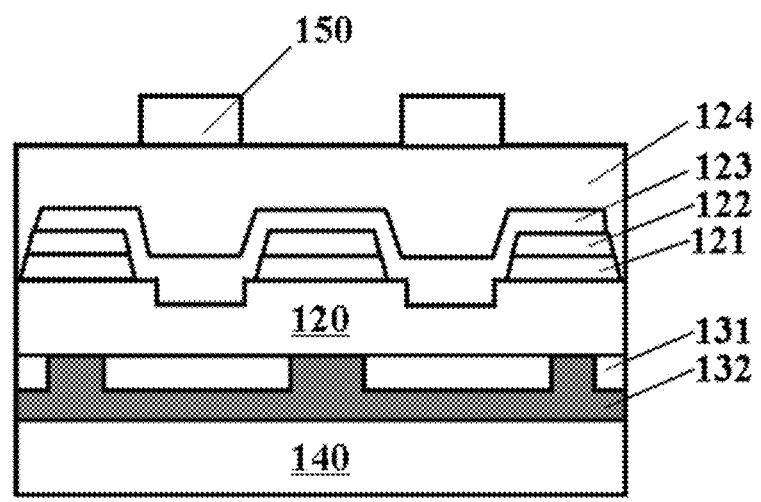
FIG. 5 is a sectional view of another LED chip structure according to some embodiments.

FIG. 5 shows a sectional view of another LED chip structure fabricated by the epitaxial structure as shown in FIG. 1. The LED chip comprises from bottom to up: a conductive substrate 140, a high-reflectivity mirror system composed of a high-reflectivity metal layer 132 and a low-reflectivity dielectric layer 131, a first semiconductor layer 120, the first semiconductor buffer layer 121, the active layer 122, the second semiconductor buffer layer 123, the second semiconductor layer 124 and top electrode 150. In this LED chip structure, bonding technology is applied twice. The substrate 110 is replaced with a conductive substrate 140 made of material which reduces light absorption; and a high-reflectivity mirror system is set between the conductive substrate 140 and the first semiconductor layer 120 to further improve light absorption of the device.

Figure 6:
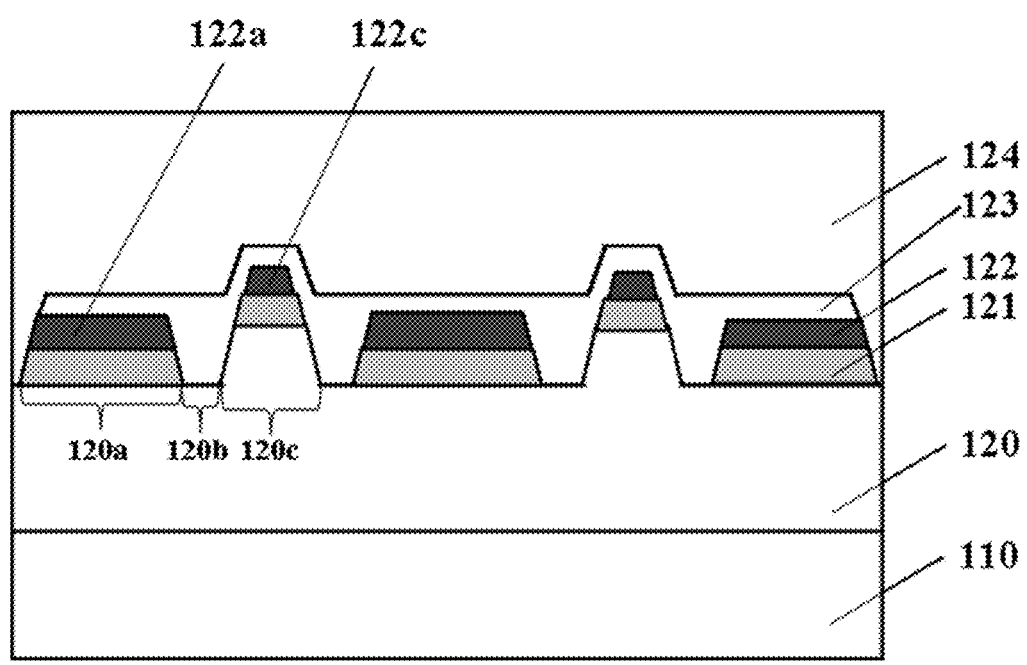
FIG. 6 is a sectional view of another LED chip structure according to the present invention.

FIG. 6 shows an epitaxial structure of a light emitting diode according to some embodiments. The LED epitaxial structure comprises: a substrate 110, a first semiconductor layer 120, an active layer 122 and a second semiconductor layer 124, wherein, the upper surface of the first semiconductor layer 120 is divided into a first growth region 120a, a second growth region 120b and a third growth region 120c, wherein, the first growth region 120a and the third growth region 120c are separated by the second growth region 120b, and the active layer 120 is formed in the first growth region 120a and the third growth region 120c of the first semiconductor layer 120 via selective epitaxial growth to form an alternating structure. This alternating design avoids second absorption during light reflection while maintaining the light emitting area basically same as that of conventional active layers.

Figure 7:
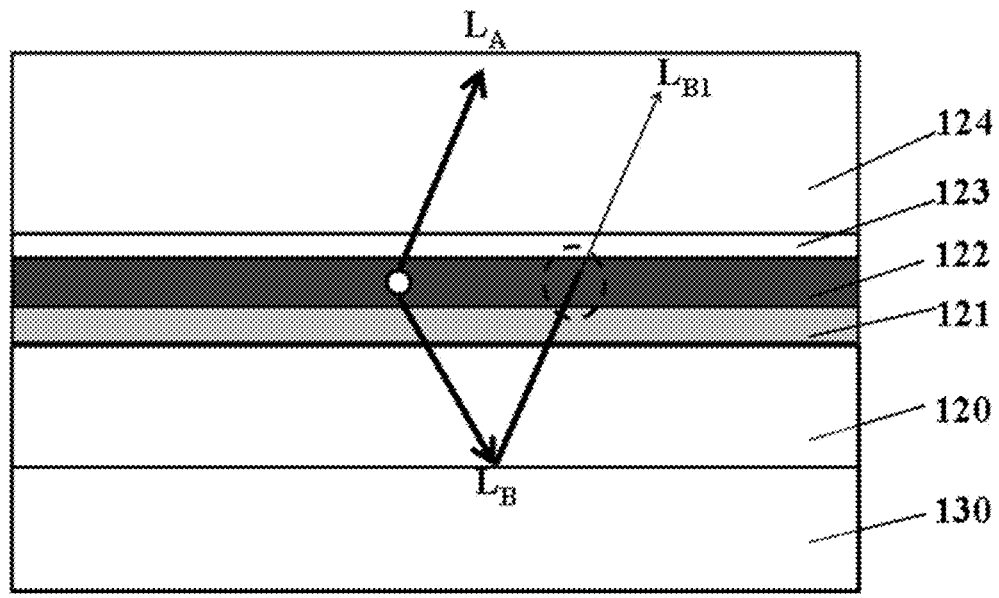
FIG. 7 illustrates light paths of a conventional LED.
Figure 8:
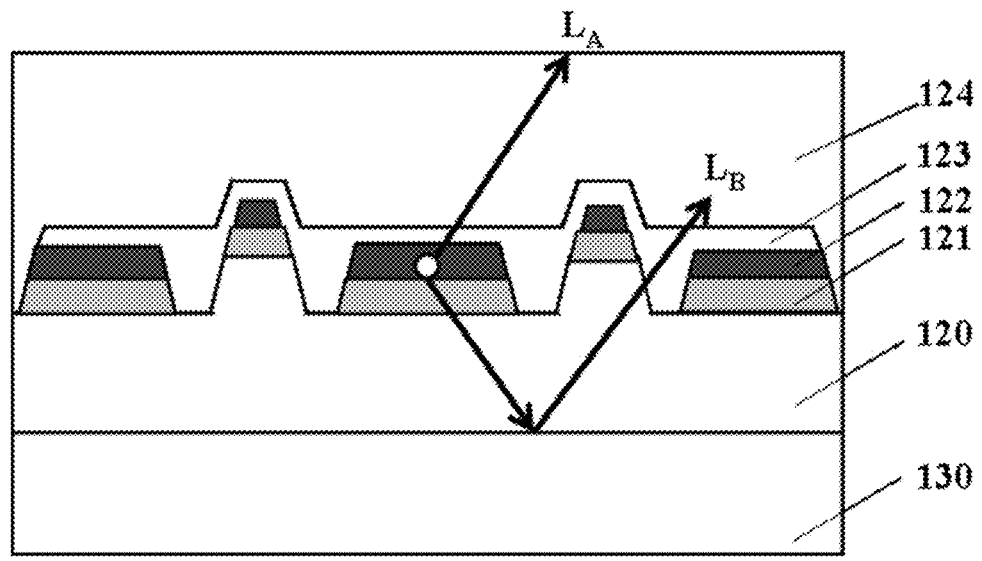
FIG. 8 illustrates light paths of an LED according to some embodiments of the present disclosure.

FIGS. 7 and 8 show light paths of a conventional LED, and a LED according to some embodiments of the present disclosure, respectively. As shown in the drawings, the active layer 122 emits lights $L_A$ and $L_B$ of different directions, wherein, $L_A$ directly emits upwards, and $L_B$ emits downwards and then emits upwards through the mirror system 130. In FIG. 7, $L_B$ emits to the quantum well of the active layer after reflection by the mirror system, and is absorbed by the quantum well; and $L_{B1}$ finally emitted out from the LED gets weaker.

As shown in FIG. 8, as the active layer 122 is an alternating quantum well structure, after reflection by the mirror system, light $L_B$ emitted by the active layer can be emitted through the connection area between the quantum wells 122a and 122c and is not absorbed by the quantum well.

As a preferred embodiment, in the aforesaid LED structure, form quantum wells of different wave bands in the first growth region and the third growth region of the first semiconductor layer respectively, thus forming a LED with mixture light. For example, grow a blue-light quantum well 120a in the first growth region, and grow a yellow-light quantum well 120c in the third growth region. The blue-light quantum well 120a can be an $In_xGa_{1-x}N/GaN$ superlattice structure, where the In component x is 0.1-0.3, and the yellow-light quantum well 120c can be an $In_yGa_{1-y}N/GaN$ superlattice structure, where the In component y is 0.3-0.6, thus forming a white-light LED chip with direct mixture at horizontal direction. By controlling areas of the first growth region and the third growth region, ratio between blue light and yellow light can be adjusted to further adjust color temperature of white light.

As another preferred embodiment, in the aforesaid LED structure, a quantum well and a double-hetero structure can be formed in the first growth region and the third growth region of the first semiconductor layer respectively. With wide well and barrier, the double-hetero structure sees less carrier overflow than that of the quantum well structure during high temperature. Therefore, the combination of a double-hetero structure can improve luminance decay caused by serious carrier overflow of the quantum well structure during high temperature. In this embodiment, grow a quantum well structure in the first growth region of the first semiconductor layer, and grow a double-hetero structure in the third growth region, wherein, area of the quantum well structure S1 is larger than or equals to area of the double-hetero structure S3 with preferred ratio of 1:1-5:1.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode comprising:
a first semiconductor layer;
an active layer; and
a second semiconductor layer,
wherein:
an upper surface of the first semiconductor layer has at least a first growth region and a second growth region;
the active layer is formed in the first growth region but not in the second growth region via selective epitaxial growth;
the second semiconductor layer covers the active layer and the second growth region of the first semiconductor layer via epitaxial growth;
when current is injected in the active layer, part of light is emitted from the active layer, and then emitted out from the second growth region after reflection;
the upper surface of the first semiconductor layer has the first growth region, the second growth region, and a third growth region;
the first and the third growth regions are separated by the second growth region;
the active layer is formed only in the first growth region and the third growth region via epitaxial growth;
the active layer in the third growth region and the active layer in the first growth region form an alternating active layer by having a height difference in the third growth region and the first growth region, thereby reducing secondary absorption during light reflection while maintaining a light emitting area; and
the second semiconductor layer covers the active layer and the second growth region of the first semiconductor layer.

2. The light emitting diode of claim 1, wherein the active layers in the first growth region and the third growth region are configured to emit light with different wave bands respectively, which mix into white light.

3. The light emitting diode of claim 1, wherein the active layer in the first growth region is a quantum well structure, and the active layer in the third growth region is a double-hetero structure.

4. The light emitting diode of claim 3, wherein areas of the first growth region and the third growth region are S1 and S3 respectively, where S1>S3.

5. The light emitting diode of claim 1, further comprising a first semiconductor buffer layer between the first semiconductor layer and the active layer, formed only in the first growth region of the first semiconductor layer via epitaxial growth.

6. The light emitting diode of claim 1, further comprising a second semiconductor buffer layer between the second semiconductor layer and the active layer, which covers the active layer and the second growth region of the first semiconductor layer via epitaxial growth.

7. The light emitting diode of claim 1, wherein: the active layer has a discrete distribution.

8. A fabrication method of a light emitting diode, the method comprising:
   1) providing a substrate, and forming a first semiconductor layer over the substrate;
   2) configuring the upper surface of the first semiconductor layer into at least a first growth region and a second growth region;
   3) forming an active layer in the first growth region of the first semiconductor layer via selective epitaxial growth; and
   4) forming a second semiconductor layer in the active layer and the second growth region of the first semiconductor layer;
   wherein when current is injected in the active layer, part of the light is emitted from the active layer after reflection from the second growth region;
   wherein:
   in step 2), dividing the upper surface of the first semiconductor layer into at least a first growth region, a second growth region and a third growth region;
   the first and the third growth regions are separated by the second growth region;
   in step 3), forming an active layer in the first growth region of the first semiconductor layer and the third growth region via epitaxial growth; and
   the active layer of the third growth and the active layer of the first growth region form an alternating active layer by having a height different in the third growth region and the first growth region, thereby reducing secondary absorption during light reflection while maintaining a light emitting area.

9. The fabrication method of claim 8, wherein step 3) comprises growing a first active layer in the first growth region, and then, growing a second active layer in the third growth region.

10. The fabrication method of claim 9, wherein the first active layer and the second active layer are configured to emit light of different wave bands, which mix into white light.

11. The fabrication method of claim 9, wherein the first active layer is a quantum well structure, and the second active layer is a double-hetero structure.

12. The fabrication method of claim 8, wherein in step 2), at first, growing a first semiconductor layer in the first growth region of the first semiconductor layer, and then growing an active layer.

13. The fabrication method of claim 12, wherein: in step 2), at first, growing a first semiconductor layer in the first growth region of the first semiconductor layer, and then growing a first semiconductor buffer layer, and lastly growing an active layer.

14. The fabrication method of claim 12, wherein: in step 4), at first, growing a second semiconductor buffer layer in the active layer and the second growth region of the first semiconductor layer via epitaxial growth, and then growing a second semiconductor layer.

15. A light-emitting system including a plurality of light-emitting diodes, each diode comprising:
   a first semiconductor layer;
   an active layer; and
   a second semiconductor layer,
   wherein:
   an upper surface of the first semiconductor layer has at least a first growth region and a second growth region;
   the active layer is formed in the first growth region but not in the second growth region via selective epitaxial growth;
   the second semiconductor layer covers the active layer and the second growth region of the first semiconductor layer via epitaxial growth;
   when current is injected in the active layer, part of light is emitted from the active layer, and then emitted out from the second growth region after reflection;
   the upper surface of the first semiconductor layer has the first growth region, the second growth region, and a third growth region;
   the first and the third growth regions are separated by the second growth region;
   the active layer is formed only in the first growth region and the third growth region via epitaxial growth;
   the active layer in the third growth region and the active layer in the first growth region form an alternating active layer by having a height difference in the third growth region and the first growth region, thereby reducing secondary absorption during light reflection while maintaining a light emitting area; and
   the second semiconductor layer covers the active layer and the second growth region of the first semiconductor layer.

16. The system of claim 15, wherein the active layers in the first growth region and the third growth region are configured to emit light with different wave bands respectively, which mix into white light.

17. The system of claim 15, wherein:
   the active layer in the first growth region is a quantum well structure, and the active layer in the third growth region is a double-hetero structure; and
   areas of the first growth region and the third growth region are S1 and S3 respectively, where S1>S3.

* * * * *